United States Patent [19]

Wright et al.

[11] 4,205,276
[45] May 27, 1980

[54] AUDIO AMPLIFIER WITH LOW AM RADIATION

[75] Inventors: John W. Wright, San Jose; William H. Gross, Sunnyvale, both of Calif.

[73] Assignee: National Semiconductor Corporation, Santa Clara, Calif.

[21] Appl. No.: 965,971

[22] Filed: Dec. 4, 1978

[51] Int. Cl.² .......................... H03F 1/34; H03F 3/183
[52] U.S. Cl. .................................... 330/294; 330/107; 330/302; 330/306; 455/341
[58] Field of Search ............... 330/107, 109, 294, 302, 330/303, 306, 307; 325/315, 317

[56] References Cited

PUBLICATIONS

Widlar, "Monolithic Operational Amplifier", *Electronic Design News*, Nov. 1964, pp. 18–29.

*Primary Examiner*—James B. Mullins
*Attorney, Agent, or Firm*—Gail W. Woodward

[57] ABSTRACT

An audio power amplifier is designed to have a wide band high fidelity response suitable for FM radio performance. The amplifier rolloff of gain versus frequency is made sufficiently steep to reduce the gain to a negligible level at the standard AM broadcast band. A stabilization network is incorporated into the amplifier to avoid instabilities that might result in oscillation. The amplifier has a very low AM broadcast band radiation so that it is useful in AM-FM radio receivers.

6 Claims, 3 Drawing Figures

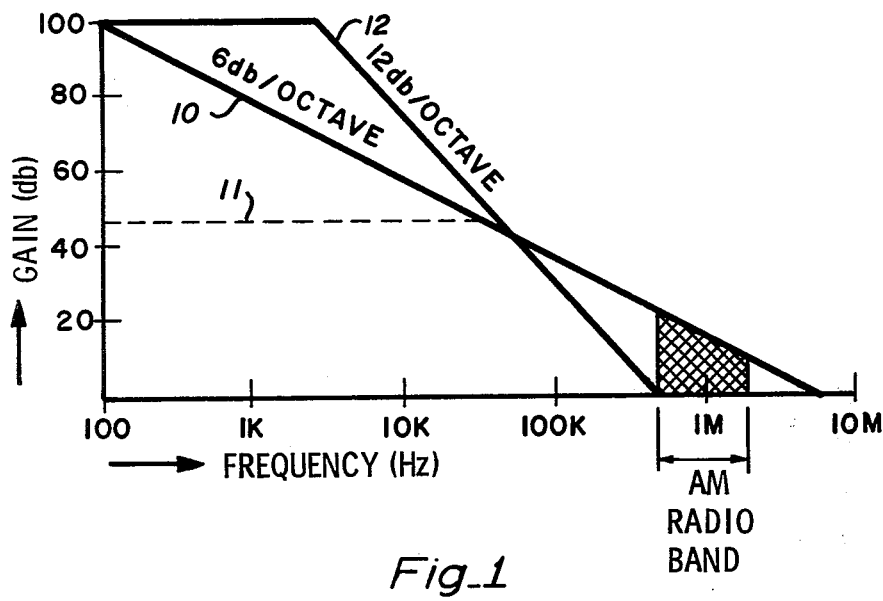
Fig_1
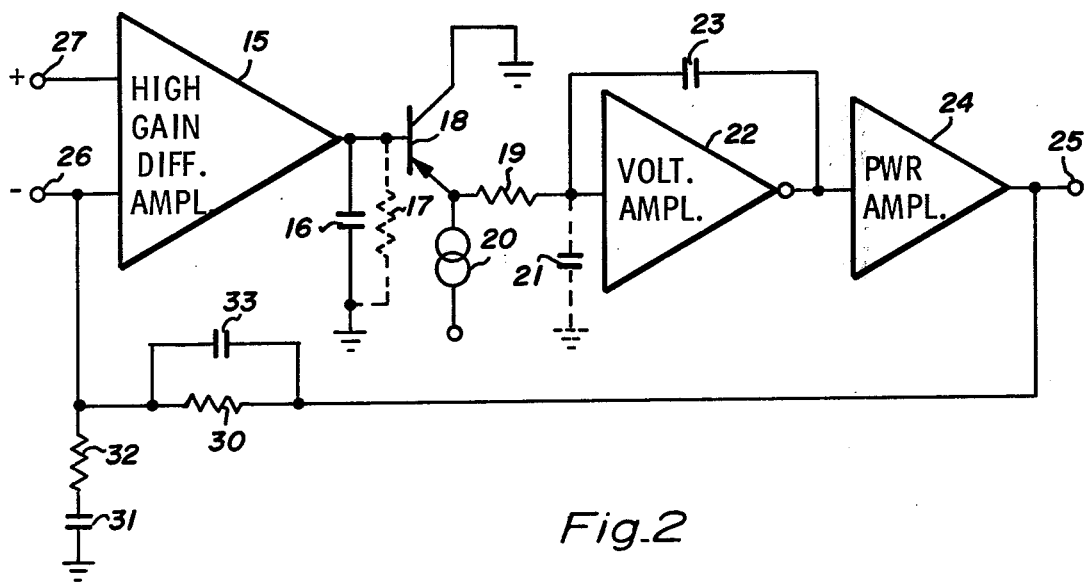
Fig_2

AUDIO AMPLIFIER WITH LOW AM RADIATION

BACKGROUND OF THE INVENTION

AM-FM radio receivers have benefited greatly from the use of integrated circuit (IC) technology. Performance has been improved and size greatly reduced. Most of the active devices can be incorporated into one or two IC chips that require a minimum of off-chip components. Thus, very small, compact high-performance FM-AM radios can be constructed at low cost.

In order to take advantage of the high-fidelity (Hi-Fi) capability of the FM band the audio amplifier section is usually made to have a relatively wide bandwidth, typically about 20 kHz. Such an amplifier using conventional design will have appreciable gain out to several MHz and will produce substantial energy in the AM broadcast band. Thus, in the AM mode of reception the audio signal will reproduce the modulation, and unfortunately, the signal transients will result in unheard and relatively useless signal components within the radio frequency passband. Also any noise generated in the amplifier will have substantial gain. Where the radio speaker and/or its associated wires are located in close proximity with the radio antenna, as would be the case in a compact radio structure, the transfer of signal energy can be appreciable. Such signals are interpreted by the receiver as noise and the normal reaction is for the receiver AGC circuits to reduce the receiver gain. This has the effect of reduced sensitivity. As a practical matter it has been found that such audio circuit noise can seriously impair AM radio performance.

It has become common practice to shunt the input of the audio amplifier with a capacitor in the AM radio mode so as to reduce the high frequency energy. While this reduces the amplifier fidelity, the loss may not be regarded as harmful because of the lower fidelity performance normally expected in AM broadcasting. However, the capacitor shunting requires an addition to the switching system that is undesirable.

In the copending application of Don R. Sauer and William A. Cocke, Ser. No. 947,981 filed Oct. 2, 1978, another solution to the problem is presented. The AM-FM radio is switched electronically by on-chip IC elements. At the same time AF amplifier bandwidth is switched so that a reduced audio fidelity is present for AM operation. This approach is useful in IC radio designs where a minimum number of chips are to be used.

It would be desirable to have an audio amplifier available which could be used directly without extra switching for radios whether AM, FM, or both. Desirably such an amplifier would produce Hi-Fi response while producing negligible signal output in the AM broadcast band.

SUMMARY OF THE INVENTION

It is an object of the invention to provide an audio amplifier capable of Hi-Fi performance for FM radios while producing a negligible signal output in the AM broadcast band.

It is a further object of the invention to employ an audio amplifier having a pair of cascaded low pass filters which produce a gain frequency rolloff of about 12 db per octave, which results in negligible gain in the AM broadcast band while having substantial gain at 20 kHz.

It is a still further object of the invention to employ an audio amplifier having a gain versus frequency rolloff of about 12 db per octave and includes means for preventing high frequency oscillation.

These and other objects are achieved in an IC amplifier configured as follows. A one pole filter is inserted between a high-gain differential input amplifier section and a high gain inverting amplifier section with capacitive feedback which nominally acts a one pole filter. The inverting amplifier drives a power output amplifier section. The two-pole filter thus obtained produces a gain versus frequency rolloff of about 12 db per octave. Thus, if a closed loop gain of 46 db is available with a −3 dB corner located at about 20 kHz, Hi-Fi performance is available. For these conditions the gain will be less than unity at about 700 kHz, which is at the low end of the AM broadcast band. Thus, the amplifier will produce very little signal energy in the broadcast band. In addition, a negative feedback loop including a high pass filter is provided from the amplifier output back to its inverting input. This feedback loop stabilizes the amplifier, permits control of the corner and acts to prevent high frequency oscillation that may tend to occur due to the steep rolloff.

BRIEF DESCRIPTION OF THE DRAWINGS

FIG. 1 is a graph showing the gain versus frequency curve for 6 and 12 db per octave slopes and the relationship to the AM radio band;

FIG. 2 is a partial schematic block diagram showing the amplifier circuit of the invention.

DESCRIPTION OF THE INVENTION

Figure 3:
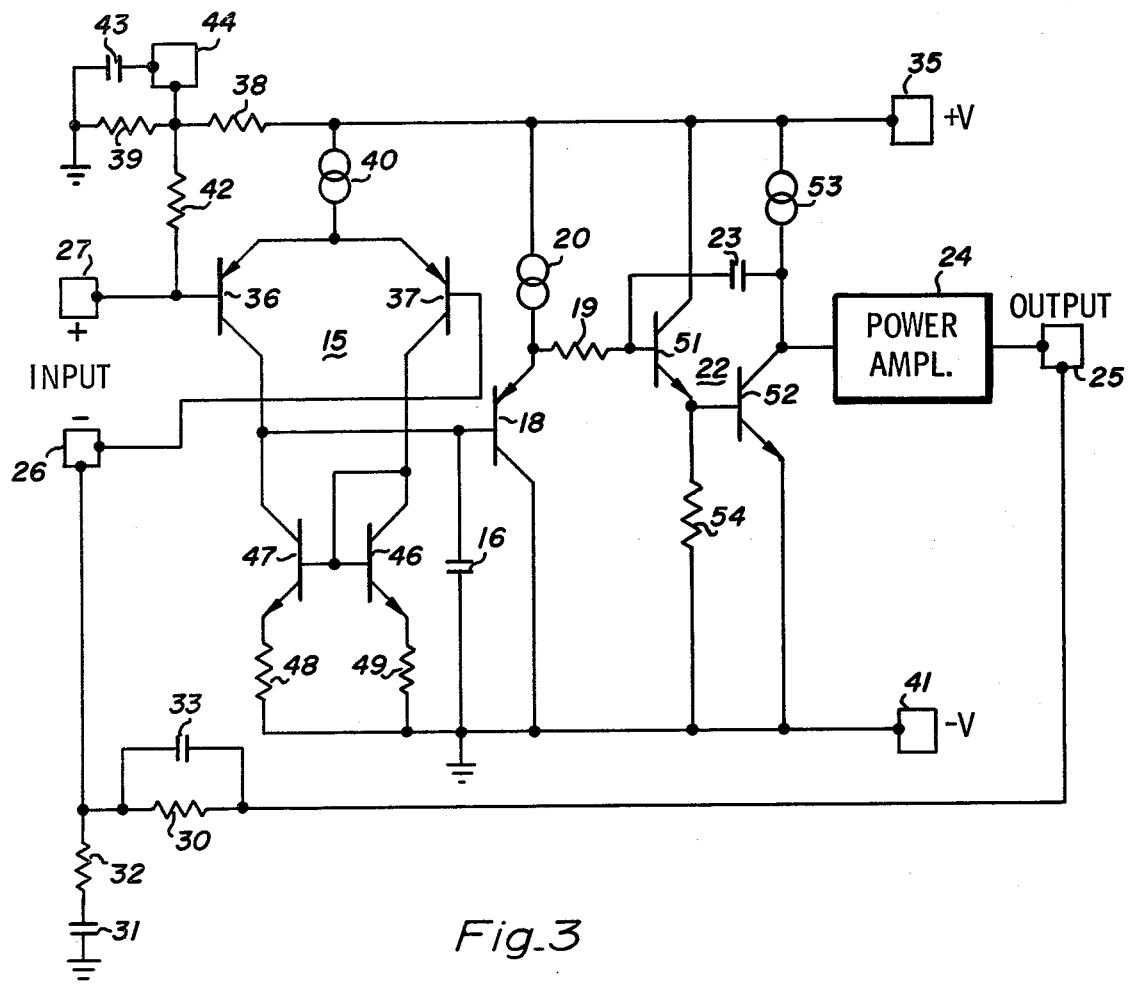
FIG. 3 is a more detailed schematic of the critical circuit portions of the invention.

Typically, audio amplifiers are made to have a 6 db per octave reduction of gain with increasing frequency. This rolloff is selected because it can be achieved with a single pole, or frequency sensitive circuit, using a simple resistance-capacitance combination. FIG. 1 shows a graph form a set of typical curves that are associated with conventional amplifiers. Curve 10 shows a typical −6 db/octave slope. The curve starts out at an open loop gain of about 100 db at about 100 Hz. The curve goes to unity or 0 db at just under 10 MHz. The AM radio broadcast band is shown by the vertical lines bracketing the 1 MHz line. The cross-hatched area shows that there is substantial gain the the AM broadcast band.

The closed loop gain level of 46 db is shown at the dashed line 11. It can be see that if the 46 db gain is to be maintained out to about 20 kHz, as is desired for Hi-Fi performance, considerable energy could be produced in the AM band. Since the output is typically coupled to a loud-speaker and since the AM radio antenna can be located relatively close to the loud-speaker and/or its connecting leads, the antenna can respond to the audio amplifier. The radio circuits ordinarily interpret the signals picked up as noise and the AGC section will operate to reduce receiver gain. This acts to substantially reduce receiver sensitivity. The problem is aggravated by the use of ferrite antennas commonly used in compact radios and still further aggravated by the small size of modern radios using IC components.

Curve 12 of FIG. 1 shows a 12 db per octave rolloff. This slope clearly shows that the 0 db intersect at the low end of the broadcast band results in Hi-Fi performance at the 46 db closed loop gain level. This curve represents the preferred response of the invention.

However, it can be seen that a lesser slope could be used with a 0 db intersect as shown but a slope that intersects the 46 db level at 20 kHz. Alternatively the 12 db per octave slope can be used and located to intersect the 46 db line at 20 kHz. In this case the zero db intersect will occur at a frequency well below the broadcast band.

FIG. 2 shows a circuit configuration that can be employed to practice the invention. The amplifier employs a high gain differential input section 15. The amplifier section 15 output is shunted by capacitor 16, which is selected to provide a filter action in conjunction with equivalent resistor 17 which is shown with a dashed connection. This combination provides a simple RC time constant circuit with a low pass chraracteristic.

Emitter follower 18 operating with a current source load 20 acts as an isolation element. Equivalent resistor 17 has a value equal to the value of resistor 19 multiplied by the Beta, or current gain, of transistor 18. Thus, resistor 17 can have a relatively large value and capacitor 16 can be physically small.

Resistor 19 in conjunction with equivalent capacitance 21 provides a second filter having a low pass characteristic and isolated from the first filter by emitter follower 18. Capacitance 21 is achieved as a Miller capacitance produced by capacitor 23 multiplied by the gain of inverting voltage amplifier 22. Thus, capacitor 23 can be relatively small and the input to voltage amplifier section 22 looks like a pure capacitive reactance. Thus, two cascaded low pass filters are present to produce a combined gain versus frequency characteristic having a 12 bd per octave rolloff.

Power amplifier section 24 is coupled between the voltage amplifier section 22 and the amplifier output terminal 25, which is typically used to drive a transducer such as a loud-speaker (not shown).

The overall amplifier has an inverting input terminal 26 and non-inverting input terminal 27, both referenced to output terminal 25. A third filter is coupled between output 25 and inverting input 26 to produce a negative feedback configuration. This filter has 100% d-c feedback, ratioed midrange frequency feedback, and high frequency high pass feedback.

Resistor 30 provides 100% d-c feedback and can if desired be an on-chip element. This feedback acts to stabilize the amplifier operating point. Capacitor 31 is large enough to act as a low impedance at all operating frequencies. Resistor 32 in conjunction with resistor 30 ratios the feedback at the operating frequencies to establish the closed loop amplifier gain value. See curve 11 of FIG. 1. Capacitor 33 is a small value that provides a high pass characteristic at frequencies just above the desired amplifier operating range. When a high gain amplifier employing substantial feedback involves a number of amplification stages, there is a good possibility that excessive phase shift in individual stages can cause high frequency oscillation, particularly in an amplifier having a steep rolloff such as 12 db per octave. Capacitor 33 is selected to have a value that will increase the feedback in the frequency region most likely to produce oscillation. This will, for the amplifier shown, be typically in the 20 kHz to 40 kHz range. The effect of this high frequency feedback loop is not shown in FIG. 1.

FIG. 3 shows the implementation of the critical circuits of FIG. 2. Like numbered elements bear the designations of FIG. 2. The square terminals are intended to show IC package pins. The IC represented in FIG. 3 is operated from a power supply connected between +V terminal 35 and ground at −V terminal 41. Amplifier section 15 includes differentially connected transistors 36 and 37 operated from current source 40. The non-inverting input terminal 27 is connected to the base of transistor 36. Equal value resistors 38 and 39 provide a potential at terminal 44 of half supply or +V/2. Capacitor 43 bypasses terminal 44 to ground for a c. Resistor 42 biases the base of transistor 36 at +V/2. Inverting input terminal 26 is connected to the base of transistor 37. Resistor 30 biases transistor 37 for d c from output terminal 25. This represents 100% negative feedback. This stabilizes the operating point where terminal 26 will track terminal 27 thus setting terminal 25 at substantially +V/2. The input circuitry is desirably fully balanced to provide high common mode input signal rejection.

Transistors 46 and 47 along with resistors 48 and 49 provide a current mirror load which results in a single-ended output for section 15 at the collector of transistor 47.

Amplifier section 15 is directly coupled to transistor 18 and capacitor 16 shunts this circuit node to ground. Emitter follower transistor 18 using current source 20 as a load couples to resistor 19 which acts with capacitor 23 as a filter.

Emitter follower transistor 51 is directly coupled to common emitter transistor 52, using resistor 54 as a load, to comprise high gain inverting amplifier section 22. Since capacitor 23 is coupled from the output back to the input of amplifier section 22, the input at the base of transistor 51 presents substantially a pure capacitive reactance. Current source 53 acts as the load for transistor 52 which drives power amplifier section 24.

EXAMPLE

The amplifier of FIG. 3 is employed in a commercial IC designated as LM396. Conventional IC construction is employed. The NPN transistors are of conventional construction. Transistor 18 is of the PNP substrate collector vertical construction. Transistors 36 and 37 are of lateral PNP construction. The following component values were used.

| Part Designation | Value | Units |
| --- | --- | --- |
| Capacitor 16 | 20 | picofarads |
| Resistor 19 | 33 | K ohms |
| Capacitor 23 | 10 | picofarads |
| Resistor 30* | 10 | K ohms |
| Capacitor 31* | 50 | microfarads |
| Resistor 32* | 51 | ohms |
| Capacitor 33* | 500 | picofarads |
| Resistors 38 and 39 | 10 | K ohms |
| Resistor 42 | 100 | K ohms |
| Capacitor 43* | 50 | microfarads |
| Resistors 48 and 49 | 5 | K ohms |
| Resistor 54 | 6.8 | K ohms |

Denotes off-chip components

The amplifier has an open loop gain of about 90 db, a closed loop gain of about 46 db, and a slope of 12 db per octave with a zero db intercept of about 700 kHz. The circuit is completely stable. When used with an FM-AM radio in which the AM antenna is close to the loud-speaker and its leads which are capacitively coupled to terminal 25 and 41, the AM radio sensitivity can be made about 10 db greater than could be employed using a conventional HiFi audio amplifier.

The invention has been described and a commercial operating example given. Clearly there are alternatives and equivalents that are within the spirit and intent of the invention that will occur to a person skilled in the art. Therefore it is intended that the scope of the invention be limited only by the claims that follow.

We claim:

1. An operational amplifier for providing substantial gain at audio frequencies and having substantially zero gain at frequencies within the AM standard broadcast band, said amplifier comprising:

gain producing amplifier means having substantial intrinsic gain at audio frequencies and at frequencies well in excess of said AM band;

means coupled within said amplifier to produce a declining gain versus frequency curve that falls to substantially zero at a frequency at the low frequency end of said AM band and wherein said curve has a slope in excess of 6 db per octave; and feedback means for further reducing the gain of said amplifier at frequencies above said audio frequencies and below said AM band whereby said amplifier is capable of high fidelity amplification, is stable within its passband, and produces very little energy within said AM band.

2. The amplifier of claim 1 wherein said means coupled within said amplifier comprise first and second low pass filters to produce a gain versus frequency curve having a slope of about 12 db per octave.

3. The amplifier of claim 2 wherein said first and second low pass filter means are isolated from each other to avoid interaction therebetween.

4. The amplifier of claim 3 wherein said first and second low pass filter means are isolated by means of an interposed emitter follower transistor stage.

5. The amplifier of claim 4 wherein said first low pass filter means comprise a shunt capacitor operating across the equivalent shunt resistance of said emitter follower input.

6. The amplifier of claim 4 wherein said second low pass filter means comprise a resistor operating in series with the equivalent shunt capacitance of a high gain inverting amplifier having a capacitor connected between input and output terminals.

* * * * *

UNITED STATES PATENT AND TRADEMARK OFFICE
CERTIFICATE OF CORRECTION

PATENT NO. : 4,205,276

DATED : May 27, 1980

INVENTOR(S) : John W. Wright and William H. Gross

It is certified that error appears in the above-identified patent and that said Letters Patent are hereby corrected as shown below:

In col. 3, line 31, change "bd" to --db--.

In col. 4, line 37, change "396" to --1896--.

In the table in col. 4 change the part values as follows:

Resistor 30* from "10" to --100--.

Capacitor 31* from "50" to --10--.

Resistor 32* from "51" to --510--.

Capacitor 33* from "500" to --50--.

Capacitor 43* from "50" to --100--.

Signed and Sealed this

Second Day of December 1980

[SEAL]

Attest:

SIDNEY A. DIAMOND

Attesting Officer

Commissioner of Patents and Trademarks